United States Patent [19]

Mayor

[11] 4,330,750
[45] May 18, 1982

[54] VARIABLE DELAY CIRCUITS

[75] Inventor: Colin Mayor, Heywood, England

[73] Assignee: International Computers Limited, London, England

[21] Appl. No.: 130,708

[22] Filed: Mar. 3, 1980

[30] Foreign Application Priority Data

Mar. 13, 1979 [GB] United Kingdom ............... 7908826

[51] Int. Cl.³ .......................................... H03K 5/159
[52] U.S. Cl. ..................................... 328/55; 307/597; 328/59
[58] Field of Search ..................... 328/55, 56, 59, 66, 328/67; 307/597, 596

[56] References Cited

U.S. PATENT DOCUMENTS

3,050,713 8/1962 Harmon ............................. 307/596
3,609,404 9/1971 Uchida ................................ 328/55

*Primary Examiner*—David K. Moore
*Attorney, Agent, or Firm*—Lee, Smith & Jager

[57] ABSTRACT

A variable delay circuit consists of a chain of logic gates with a selection circuit for selecting the output of any chosen one of the gates. A variable voltage is connected to the emitter load resistors of the gates, and permits the overall delay to be adjusted.

3 Claims, 1 Drawing Figure

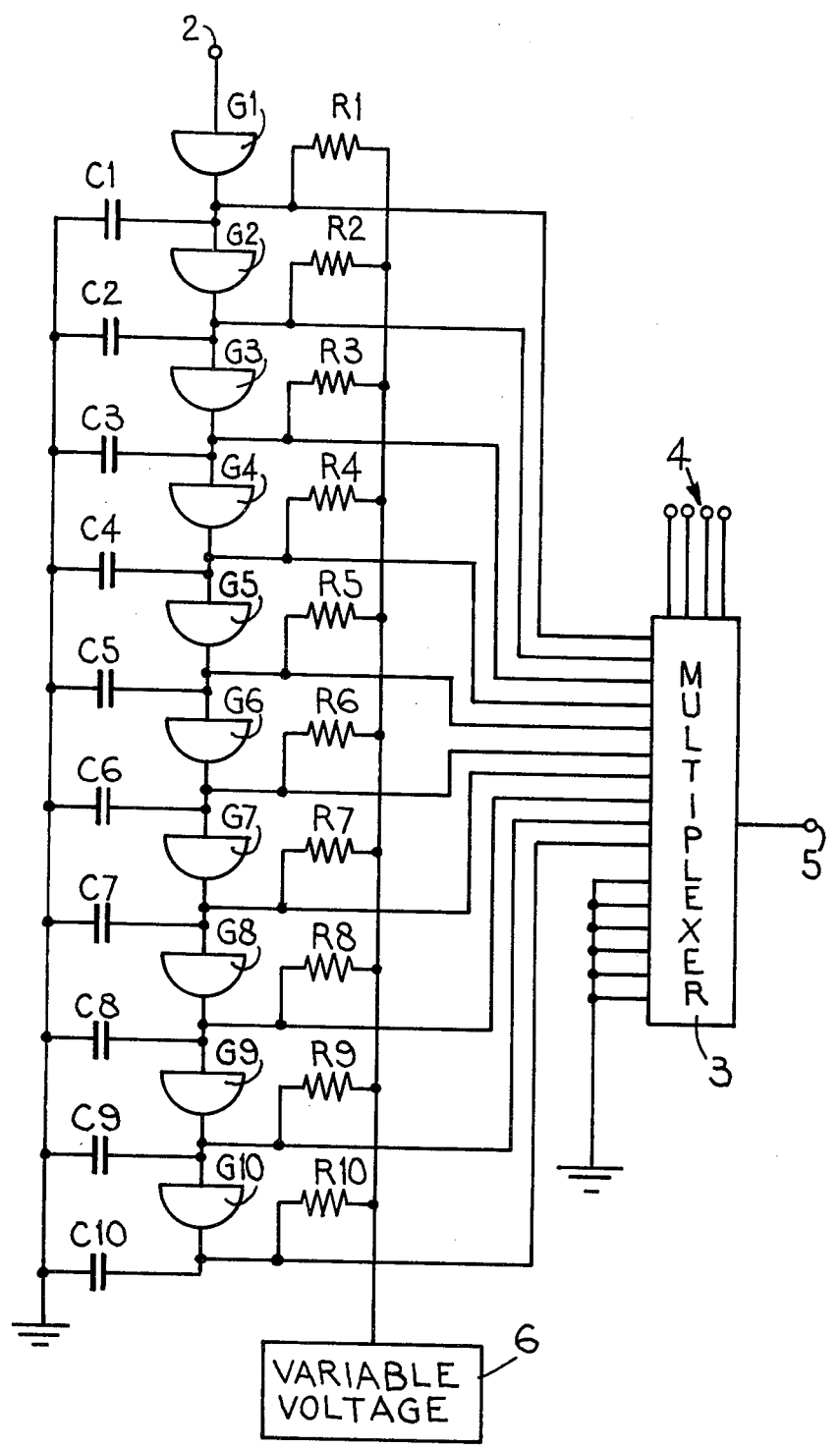

VARIABLE DELAY CIRCUITS

BACKGROUND OF THE INVENTION

This invention relates to variable delay circuits.

DESCRIPTION OF THE PRIOR ART

Various methods of producing delays are known in the art. For example, delays may be produced by capacitive or inductive circuits, or ultrasonic delay lines. However, none of these methods is suitable for producing very small delays, e.g. in the order of a few nanoseconds.

SUMMARIES OF THE INVENTION

According to the invention, there is provided a variable delay circuit comprising a plurality of delay devices each having input and output connections and an intrinsic delay period and being connected in series such that a signal applied to the input connection of the first delay device of the series will cascade through each delay device in the series in turn being progressively delayed by said intrinsic delays; a circuit output terminal; a selection circuit for selectively connecting the output connection of any chosen delay device to said output terminal and means enabling collective adjustment of the intrinsic delays of the delay devices.

The invention is thus capable of producing delays of the order of the intrinsic delay times of the delay devices. Thus in the case where the delay devices are logic devices, the delays produced can be of the order of 1 nanosecond per gate. Moreover, the delay is readily variable by means of the selection circuit.

In a preferred form of the invention, in which the delay devices are logic gates a variable voltage supply is connected to at least one of the logic gates and is arranged to vary the threshold voltage at which each such gate becomes enabled, thereby permitting adjustment of the intrinsic delay of each such gate. This provides a means of trimming the intrinsic delays of the gates to a desired value.

BRIEF DESCRIPTION OF THE DRAWINGS

One embodiment of the invention will now be described with reference to the accompanying drawing, which is a circuit diagram of a delay circuit in accordance with the invention.

DESCRIPTION OF THE PREFERRED EMBODIMENT

Referring to the drawing, the delay circuit comprises a chain of ten delay devices in the form of logic gates G1–G10, connected in series. The input of the first gate in the series is connected to an input terminal 2. Thus, a signal of a form suitable for the type of delay device used and injected into the input terminal 2 will cascade through the chain of gates, being progressively delayed as it passes through each gate.

In this embodiment of the invention, the logic gates G1–G10 are provided by Fairchild F100K integrated circuit logic elements, type 100102. These are emitter-coupled logic gates, each gate having an intrinsic delay of approximately 900 picoseconds.

The outputs of the ten gates are connected to respective inputs of a 16-to-1 multiplexer 3, the six unused inputs of the multiplexer being connected to zero potential. The multiplexer 3 selects one of its inputs, according to the binary code applied to four control terminals 4, the selected input being fed to an output terminal 5.

In this embodiment, the multiplexer is a Fairchild type 100164 multiplexer.

Trimming capacitors C1–C10 are connected between the output of respective gates G1–G10 and ground potential. The values of these capacitors are chosen (usually in the range 0–10 picofarads) so as to make the delays of all the logic gates equal, compensating for any irregularities in the intrinsic delays.

The output of the gates G1–G10 are also connected to respective emitter load resistors R1–R10, each having a value of 68 ohms. Normally, these resistors should be connected to a fixed voltage supply of 2 volts. However, in the present embodiment, the resistors R1–R10 are connected to a variable voltage source 6, which produces a voltage output variable in the range 1.8–1.9 volts. Variation of this voltage alters the threshold level at which each of the gates G1–G10 becomes enabled, and thus varies the intrinsic delays of the gates. This permits the delays of all the gates to be trimmed together, so as to adjust them all to a desired value (e.g. 1 nanosecond). When the delay circuit has been suitably trimmed in this way, it is capable of producing accurate delays in the range 1–10 nanoseconds, according to the binary code applied to the control terminals 4.

I claim:

1. A variable delay arrangement including input and output terminals; a plurality of delay circuit elements, each such element comprising a logic circuit with an "intrinsic" delay period and having input and output connections, the elements being connected in a serial mode by way of the input and output connections with the input connection of the first logic element connected to the input terminal;

means for enabling the separate and individual trimming of the time delay produced by each circuit element;

means for enabling simultaneous collective trimming, independently of the individual trimming, of all of the circuit elements;

a delay element selection means having a plurality of operational settings, a plurality of input connections; and an output connection connected with said output terminal and a control connection between the output of each said delay element and an associated one of the inputs of the selection means whereby each setting of the selection means represents a predetermined number of the delay elements serially interposed between the input and output terminals, so that each selection means setting is characteristic of a particular time delay.

2. A variable delay arrangement as claimed in claim 1, in which the means for enabling simultaneous collective trimming of the intrinsic delay periods of the delay elements, includes a variable voltage supply connected to each said relay device so as to enable variation of the threshold voltage at which each said delay element becomes enabled thereby permitting adjustment of the intrinsic delays of the elements.

3. A variable delay arrangement as claimed in claim 2, in which the selection means comprises a multiplexor having, in addition, to said output and said input connections further inputs connectable to receive control signals for controlling the selection of the particular delay element to be applied to the multiplexor output.

* * * * *